US007361286B2

(12) United States Patent
Kim et al.

(10) Patent No.: US 7,361,286 B2
(45) Date of Patent: Apr. 22, 2008

(54) METHOD OF DETECTING ETCHING END-POINT

(75) Inventors: Young-Hyun Kim, Suwon-si (KR); Yu-Dong Bae, Suwon-si (KR); Jung-Kee Lee, Suwon-si (KR); In Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 219 days.

(21) Appl. No.: 11/222,136

(22) Filed: Sep. 8, 2005

(65) Prior Publication Data

US 2006/0105539 A1 May 18, 2006

(30) Foreign Application Priority Data

Nov. 17, 2004 (KR) ..................... 10-2004-0094374

(51) Int. Cl.
*G01L 21/50* (2006.01)
*G01R 31/00* (2006.01)

(52) U.S. Cl. .......................... 216/60; 435/425; 435/16; 435/40; 435/745; 435/689; 372/50; 372/50.1; 216/59; 216/84; 216/83; 216/58

(58) Field of Classification Search .................. 216/60
See application file for complete search history.

(56) References Cited

U.S. PATENT DOCUMENTS 6,810,059 B2 * 10/2004 Chino ...................... 372/50.1

OTHER PUBLICATIONS

Carpenter et al. (Through-wafer Via Etch Throughput Improvement in a GaAs Semiconductor Device; GaAsManTech 2004; May 3, 2004 to May 6, 2004, Miami Florida, USA).*

* cited by examiner

*Primary Examiner*—Shamim Ahmed
*Assistant Examiner*—Patricia A. George
(74) *Attorney, Agent, or Firm*—Cha & Reiter, LLC

(57) ABSTRACT

A method of detecting an etching end-point includes the steps of: forming a mask on a pattern area of an etching object; forming an etching indicator on an etching area of the etching object, which is not covered by the mask; etching the etching object using the mask; and evaluating the size of a remaining object covered by the mask using the etching indicator.

10 Claims, 6 Drawing Sheets

(a)

(b)

(c)

(d)

(e)

(f)

(g)

(h)

(i)

METHOD OF DETECTING ETCHING END-POINT

CLAIM OF PRIORITY

This application claims priority under 35 U.S.C. § 119 to an application entitled "Method of Detecting Etching End-Point," filed in the Korean Intellectual Property Office on Nov. 17, 2004 and assigned Serial No. 2004-94374, the contents of which are incorporated herein by reference.

BACKGROUND OF THE INVENTION

1. Field of the Invention

The present invention relates generally to an etching process for fabricating semiconductor components and in particular, to a method of detecting an etching end-point during a process of etching objects to yield a desired pattern using a mask. More specifically, the present invention relates generally to a method of detecting an etching end-point at which the size of a remaining object covered by a mask reaches a target size.

2. Description of the Related Art

A laser diode has an active layer with a narrow width in which a laser oscillates which is formed by growing a multi-quantum well (MQW) on a wafer using a metal-organic chemical vapor deposition (MOCVD) technique or a molecular beam epitaxy (MBE) technique.

In order to fabricate an active layer of a laser diode, first, an active layer is grown on an n+ type semiconductor substrate using the MOCVD technique or the MBE technique, and a p+ type semiconductor clad for current supply is layered on the active layer. Second, a mask layer of a dielectric substance such as $SiO_2$ or SiNx is layered on the clad to form a mask. Third, the mask (the patterned mask layer) is formed by etching the mask layer to represent a predetermined rectangular pattern using a photolithography process. Fourth, the active layer and clad are dry-etched or wet-etched to represent the predetermined rectangular pattern using the mask. The width of a remaining active layer covered by the mask is generally 1 to 1.6 μm to maintain a single mode, while the width of a spot size converting region is generally 0.4 to 0.6 μmin in a case where the spot size converting region is formed on an edge of the remaining active layer to easily arrange with an optical fiber.

In addition, a mask may be formed on an active layer, and a clad may be layered after the process of etching the active layer is finished.

In the active layer etching process, since an etching speed is not fixed and an interface state between the clad (or active layer) and the mask is not uniform, the width of the remaining active layer obtained through the etching process is not uniform even if the same mask is used. As such, it is common that an etching time is shorten and necessary to determine whether a desired target size is achieved by observing the width of the remaining active layer and the width of the mask using a microscope. Further, an additional etching process is required in a case where the width of the remaining active layer is formed more widely than the norm.

When a computer simulation of the remaining active layer is performed to estimate a laser oscillation characteristic and a far field pattern (PPF), a tolerance width of the remaining active layer to obtain the desired characteristics is ±0.1 μm. However, when the width of the remaining active layer is observed through an optical microscope using a visible ray, it is difficult to exactly know the width of the remaining active layer as it is difficult to distinguish a difference of below 0.2 μm. Accordingly, when laser diode components are fabricated, the laser oscillation characteristic and the PPF are frequently off from the desired outcome.

As described above, the conventional method of detecting an etching end-point using an optical microscope is not accurate. Accordingly, there is a need for an improved method of detecting an etching end-point with more accuracy.

SUMMARY OF THE INVENTION

According to one aspect of the present invention, there is provided a method of detecting an etching end-point which includes the steps of: forming a mask on a pattern area of an etching object; forming at least one etching indicator on an etching area of the etching object, which is not covered by the mask; etching the etching object using the mask; and detecting the size of a remaining object covered by the mask using the etching indicator.

BRIEF DESCRIPTION OF THE DRAWINGS

The above features and advantages of the present invention will become more apparent from the following detailed description when taken in conjunction with the accompanying drawings in which.

DETAILED DESCRIPTION

Figure 1:
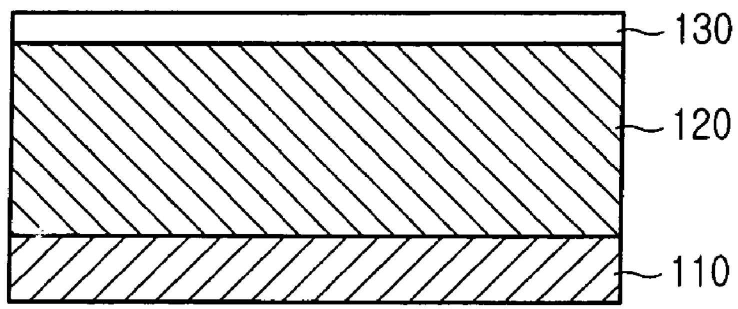
FIGS. 1 to 5 are illustrative diagrams showing a method of detecting an etching end-point chip by chip according to a first embodiment of the present invention.

Embodiments of the present invention will be described herein below with reference to the accompanying drawings. In the drawings, the same or similar elements are denoted by the same reference numerals even though they are depicted in different drawings. For the purposes of clarity and simplicity, well-known functions or constructions are not described in detail as they would obscure the invention in unnecessary detail.

Figure 2:
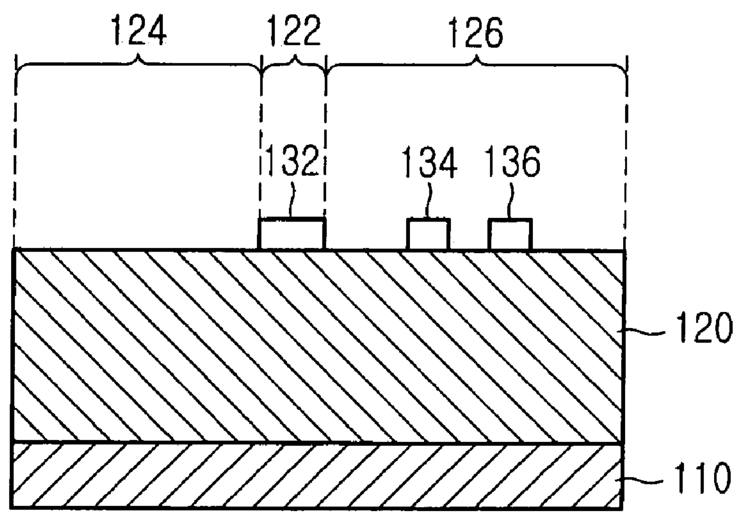
Figure 3:
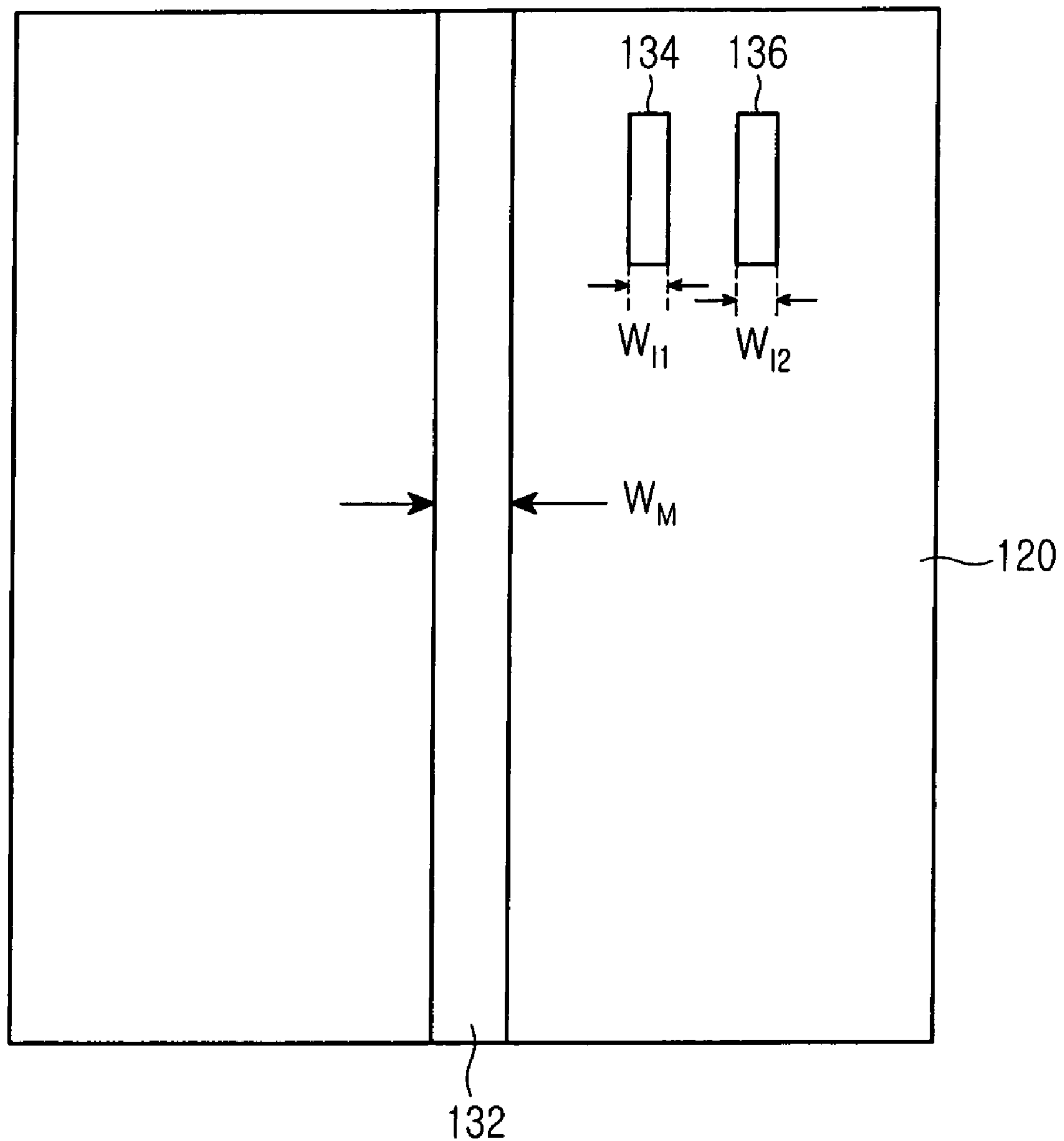

FIGS. 1 to 5 are diagrams illustrating a method of detecting an etching end-point chip by chip according to a first embodiment of the present invention. In particular, FIGS. 1 to 3 are illustrative diagrams of forming etching indicators. Briefly, the method of detecting an etching end-point includes the steps of: forming etching indicators; and detecting the etching end-point using the etching indicators.

Referring to FIG. 1, an active layer 120 of a multi-quantum well (MQW) structure, which is an etching object, is grown on a chip-by-chip semiconductor substrate 110 using a metal-organic chemical vapor deposition (MOCVD) technique or a molecular beam epitaxy (MBE) technique. A photoresist photolithography is performed on the mask layer 130. A mask layer 130 of a dielectric substance such as $SiO_2$ or SiNx is layered on the active layer 120. In addition to the dielectric substance, metal, a high molecular substance, or a substance such as a semiconductor having a different physical property from that of the active layer 120 may be used for the mask layer 130.

Referring to FIG. 2 and FIG. 3, which is a plan view of FIG. 2, by performing the photolithography of the mask layer 130, a mask 132 (one pattern of the mask layer 130) is formed on a pattern area 122 of the active layer 120, and first and second etching indicators 134 and 136 (other patterns of the mask layer 130) are formed on etching areas 124 and 126 of the active layer 120, which are not covered by the mask 132.

Each of the mask 132 and first and second etching indicators 134 and 136 has a rectangular or stripe shape of a predetermined width and a length greater than the width. The width $W_M$ of the mask 132 is greater than a target width $W_T$ of the active layer 120 since a portion of the active layer 120 in the pattern area 122 is etched in the center direction (width direction) from edges in a subsequent etching process. Thus, the width $W_M$ of the mask 132 is set considering an etching speed (width direction) of the active layer 120. To obtain the target width $W_T$, though one etching indicator (herein, the first etching indicator 134) is enough, two etching indicators 134 and 136 are illustrated to describe the etching process in the first embodiment. In alternate embodiment, 1 to 20 etching indicators can be generated on the active layer 120, wherein a width difference between the etching indicators can be set to 0.01 to 2 μm.

The width $W_{I1}$ of the first etching indicator 134 is determined by Equation 1.

$$W_{I1}=W_M-W_T \quad (1)$$

When the width $W_M$ of the mask 132 is 5.2 μm, if the target width $W_T$ is 0.4 μm, the width $W_{I1}$ of the first etching indicator 134 is set to 4.8 μm (=5.2 μm−0.4 μm), and if the target width $W_T$ is 0.5 μm, the width $W_{I1}$ of the first etching indicator 134 is set to 4.7 μm (=5.2 μm−0.5 μm). In the first embodiment, the width $W_M$ of the mask 132 is 5.2 μm, the width $W_{I1}$ of the first etching indicator 134 is 4.8 μm, and the width $W_{I2}$ of the second etching indicator 136 is 4.7 μm.

Figure 4:
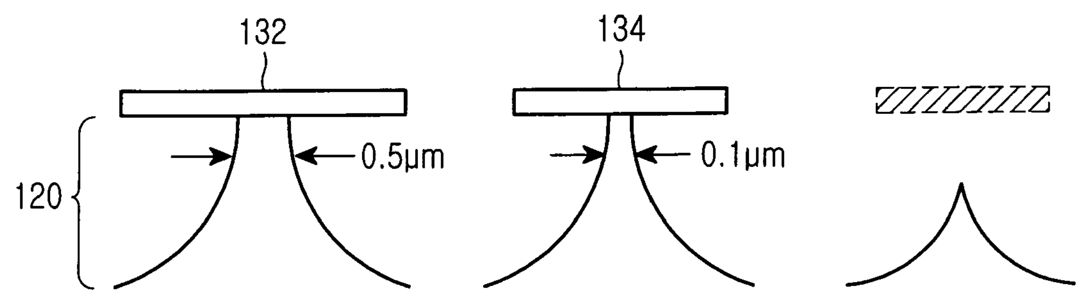
Figure 5:
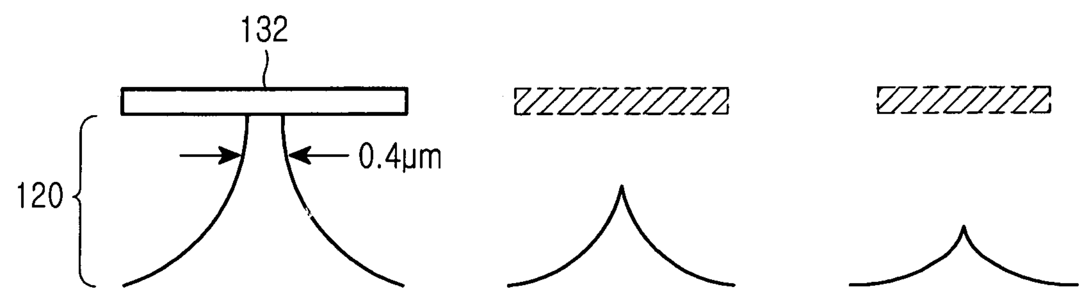

FIGS. 4 and 5 illustrate the process of detecting the etching end-point using the first etching indicator 134. It is assumed that an etching method includes a dry-etching method and a wet-etching method using an etching solution and the etching speed of the width direction of the active layer 120 is constant regardless of the width of the mask 132 on the same wafer.

Referring to FIG. 4, during the etching process, if the width of the remaining active layer 120 in the pattern area 122 is 0.5 μm, the width of the remaining active layer 120 in the etching areas 124 and 126 is below 0.1 μm, and the width of the remaining active layer 120 covered by the second etching indicator 136 is 0 μm. Accordingly, the second etching indicator 136 disappears (like in a common lift-off process).

An operator recognizes that the width of the remaining active layer 120 in the pattern area 122 is 0.5 μm by confirming that the second etching indicator 136 disappeared using an optical microscope and then progresses an additional etching process.

Referring to FIG. 5, during the additional etching process, if the width of the remaining active layer 120 in the pattern area 122 is 0.4 μm, the width of the remaining active layer 120 in the etching areas 124 and 126 is 0 μm. Accordingly, the first etching indicator 134 disappears, too.

The operator recognizes that the width of the remaining active layer 120 in the pattern area 122 is 0.4 μm, which is the target width $W_T$, by confirming that the first etching indicator 134 disappeared using the optical microscope and then finishes the etching process.

Figure 6:
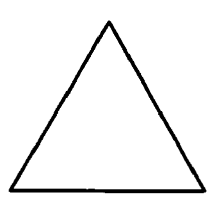
FIGS. 6 and 7 are diagrams of various shapes of an etching indicator according to the first embodiment of the present invention.
Figure 6:
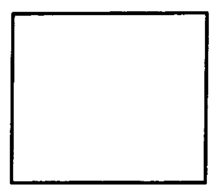
Figure 6:
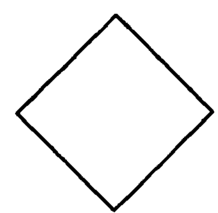
Figure 6:
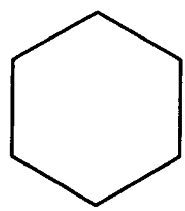
Figure 6:
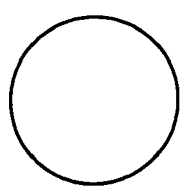
Figure 7:
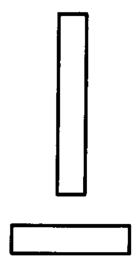
Figure 7:
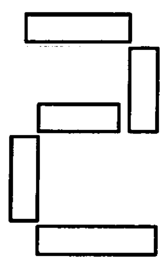
Figure 7:
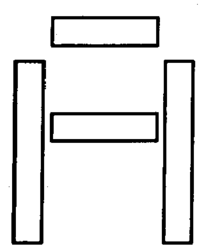

FIGS. 6 and 7 illustrate various shapes of an etching indicator according to the first embodiment of the present invention. As shown, the etching indicator can have various shapes according to modes (an etching characteristic that a substance of an etching object has, an etching method, and a target pattern of the etching object) in which the etching object is etched. It is preferable that the etching indicator has the size of 2 to 10 μm wide and 2 to 200 μm long.

To exactly know a point for ending an etching process (i.e., an etching end-point), an etching indicator having a similar shape to a desired target pattern of an object is used. For example, when a rectangular pattern is produced by etching the object, it is suitable that a rectangular etching indicator or a square-shaped etching indicator is used considering a margin of a space at which the etching indicator is located in the subject (e.g., a chip). In addition, when a circular pattern is produced by etching the object, it is suitable that an elliptical etching indicator or a circular etching indicator is used considering a margin of a space at which the etching indicator is located in the subject (e.g., a chip). FIG. 6A shows a triangular etching indicator, FIG. 6B shows a quadrangular etching indicator, FIG. 6C shows a lozenge-shaped etching indicator, FIG. 6D shows a hexagonal etching indicator, FIG. 6E shows a circular etching indicator, and FIG. 6F shows an elliptical etching indicator.

If the shape of an etching indicator is determined to be the same as a target pattern of an object, a method of setting the size of the etching indicator will now be described.

The size (defined as the width) of the quadrangular etching indicator shown in FIG. 6B is determined as a value obtained by subtracting a target size (defined as the width of the target pattern of the object) from the width of a square-shaped mask. The size (defined as a diameter) of the circular etching indicator shown in FIG. 6E is determined as a value obtained by subtracting a target size (defined as a diameter of the target pattern of the object) from a diameter of a circular mask. The size (defined as double the shortest distance among distances between sides and the center) of the polygonal etching indicators such as the triangular etching indicator, the lozenge-shaped etching indicator and the hexagonal etching indicator shown in FIGS. 6A, 6C and 6D is determined as a value obtained by subtracting a target size (defined as double the shortest distance among distances between sides of the target pattern of the object and the center) from the size of a polygonal mask. Besides the shapes, an etching indicator according to the present embodiment can have a shape of another polygon, a number, or a character.

Since there is inconvenience that information on the width of an etching indicator of a general figure must be pre-known, a number or character shape is used as shown in FIGS. 7G, 7H and 7I so that each etching indicator itself represents its own size. FIG. 7G shows a ‘1’-shaped etching indicator, FIG. 7H shows a ‘2’-shaped etching indicator, and FIG. 7I shows an ‘A’-shaped etching indicator. Herein, since detection of a correct etching point can be obstructed due to the width of an angled portion greater than that of a linear or curved portion, the number or character is configured in a shape of separated rectangular units. In addition, the width of each rectangular unit is defined as a value obtained by subtracting a target size (the width of the target pattern of the object) from the size of a mask of an object (defined as the width, a diagonal or a diameter of the mask).

As described above, the method of detecting an etching end-point according to the present embodiment can be applied chip by chip, and in this case, since the size of a chip is too small, the operator needs to detect the etching end-point using a microscope.

As described below, a method of detecting an additional etching end-point according to the present invention can be applied wafer by wafer, and in this case, unlike the method using a microscope described above, the operator can detect an etching end-point with the naked eye.

Figure 8:
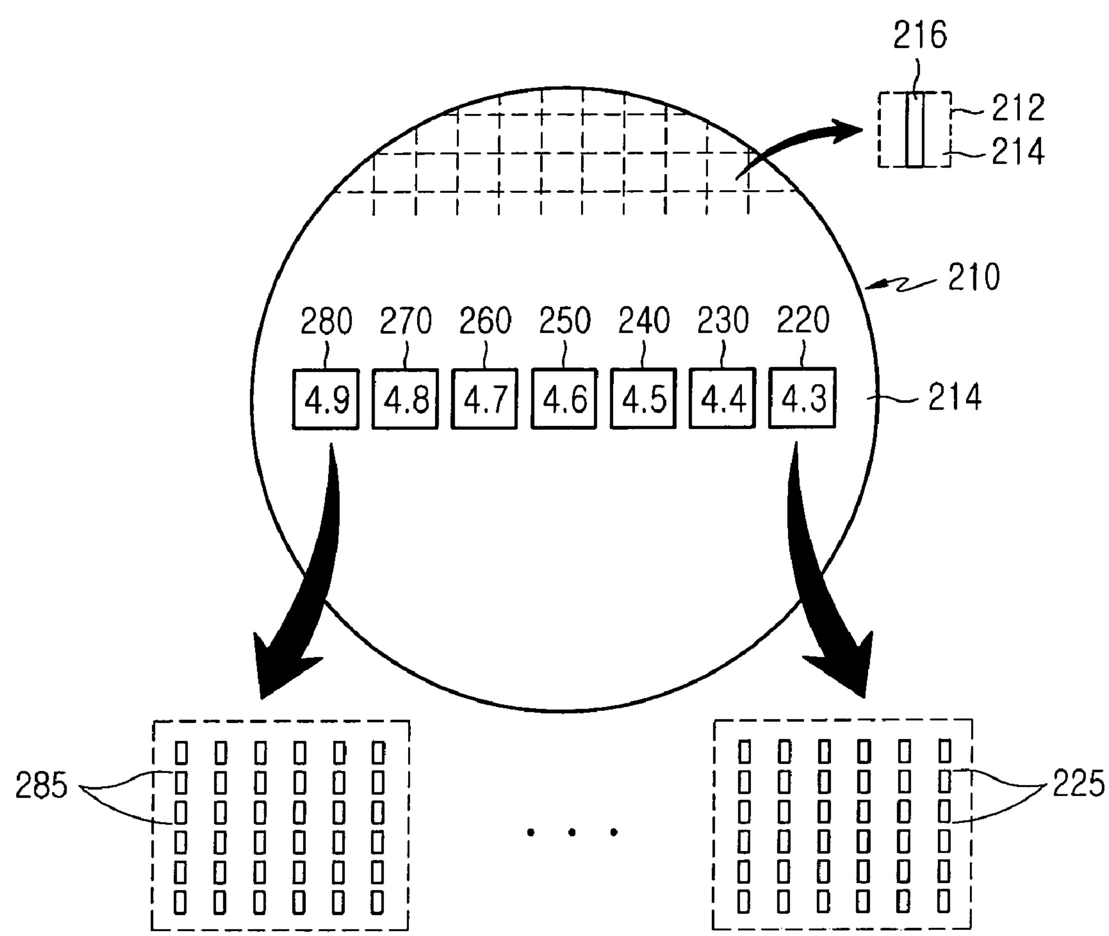
FIGS. 8 to 10 are illustrative diagrams of a method of detecting an etching end-point according to a second embodiment of the present invention.
Figure 9:
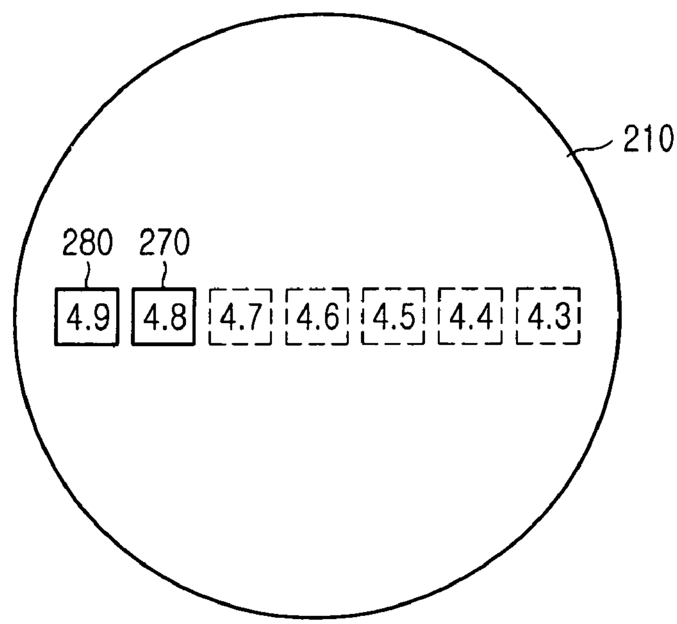
Figure 10:
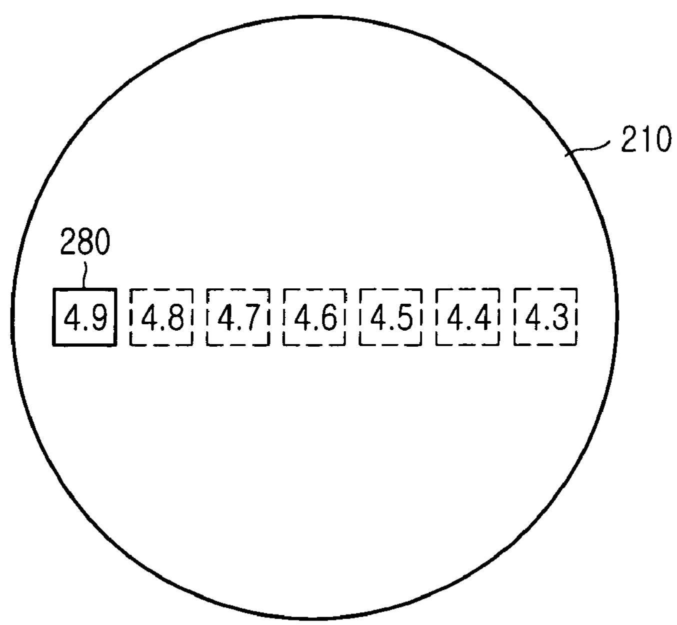

FIGS. 8 to 10 are illustrative diagrams showing a method of detecting an etching end-point according to a second embodiment of the present invention. Briefly, the method of detecting an etching end-point includes the steps of: forming etching indicators; and detecting the etching end-point using the etching indicators.

FIG. 8 is a diagram of a wafer 210 having first to seventh etching indicators 220 to 280. As shown, each of the first to seventh etching indicators 220 to 280 has an area of 1×1 mm, and the first to seventh etching indicators 220 to 280 are comprised of units 225 to 285 of a 100×70 matrix structure. The first to seventh etching indicators 220 to 280 have units of widths of 4.3 μm, 4.4 μm, 4.5 μm, 4.6 μm, 4.7 μm, 4.7 μm, and 4.9 μm in order. If necessary, a difference of the unit widths can be set to 0.01 to 2 μm. An active layer 214, which is an etching object, is formed on the wafer 210 divided into a plurality of chips 212. A rectangular mask 216 is formed in a pattern area of a portion of the active layer 214, which each chip 212 occupies. The width of the mask is 5.2 μm, and a target width of a portion of the active layer 214, which each chip 212 occupies, is 0.4 μm. The first to seventh etching indicators 220 to 280 are formed on the active layer 214. If necessary, each of the first to seventh etching indicators 220 to 280 can have the size of 200 to 5000 μm×300 to 5000 μm and have a triangular, rectangular, circular, elliptical, lozenged, another polygonal, number, or character shape. If necessary, each of the units 225 to 285 can have the size of 2 to 10 μm×2 to 200 μm and have a triangular, rectangular, circular, elliptical, lozenged, another polygonal, number, or character shape. In addition, for the units 225 to 285, a dielectric substance, metal, a high molecular substance, or a substance such as a semiconductor having a different physical property from that of the active layer 214 can be used.

FIGS. 9 and 10 are illustrative diagrams showing a process of detecting an etching end-point using the first to seventh etching indicators 220 to 280. Herein, an etching method includes a dry-etching method and a wet-etching method using an etching solution, and the etching speed of the width direction of the active layer 214 is constant regardless of the width of the mask 216.

Referring to FIG. 9, during an etching process, if the width of the remaining active layer 214 in each pattern area is 0.5 μm, the first to fifth etching indicators 220 to 260 disappear.

The operator recognizes that the width of the remaining active layer 214 is 0.5 μm by confirming with the naked eye that up to the fifth etching indicator 260 disappeared and then progresses an additional etching process.

Referring to FIG. 10, during the additional etching process, if the width of the remaining active layer 214 is 0.4 μm, the sixth etching indicator 270 disappears, too.

The operator recognizes that the width of the remaining active layer 214 is 0.4 μm by confirming with the naked eye that the sixth etching indicator 270 disappeared and then finishes the etching process.

As described above, a method of detecting an etching end-point according to an embodiment of the present invention can improve accuracy rather than the prior art using etching indicators visible to a microscope or the naked eye.

In addition, in a case where a method of detecting an etching end-point according to an embodiment of the present invention is applied to optical semiconductor chips such as laser diodes, by integrating etching indicators on the chips, after chip completion, the width of light-emitting points can be exactly known by seeing the etching indicators on the chip surfaces using a microscope without cutting a chip, and if necessary, chips can be discriminated according to the width of light-emitting points.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of detecting an etching end-point, the method comprising the steps of:

(a) forming a mask on a pattern area of an etching object;

(b) providing a plurality of etching indicators having different sizes on an etching area of the etching object that is not covered by the mask;

(c) etching the etching object using the mask; and (d) determining the size of a remaining object covered by the mask according to the sequential disappearance of a etching indicators, wherein the etching indicators are spaced apart from each other.

2. The method of claim 1, wherein the determining step is performed by an operator using an optical microscope.

3. The method of claim 1, wherein each of the etching indicators has the size of 2 to 10 μm×2 to 200 μm.

4. The method of claim 1, wherein the etching indicators have a different number of shapes or different character shapes.

5. The method of claim 1, wherein each of the etching indicators is made up of a dielectric substance, metal, a high molecular substance, or a semiconductor substance.

6. The method of claim 1, wherein all of the plurality of etching indicators have a rectangular shape, and a width difference between the plurality of etching indicators is set to 0.01 to 2 μm.

7. The method of claim 1, wherein both the mask and the etching indicators have a rectangular shape, and the width of one of the etching indicators is determined as a value obtained by subtracting a target width of the etching object from the width of the mask.

8. The method of claim 1, wherein each of the plurality of etching indicators is comprised of a plurality of units.

9. The method of claim 8, wherein the plurality of etching indicators have different unit widths, and a difference between the unit widths is set to 0.01 to 2 μm.

10. A method of detecting an etching end-point, the method comprising the steps of:

(a) forming a mask on a pattern area of an etching object;

(b) providing at least one etching indicator on an etching area of the etching object that is not covered by the mask;

(c) etching the etching object using the mask; and (d) determining the size of a remaining object covered by the mask according to a presence of the at least one etching indicator, wherein the etching object includes an optical semiconductor chip, wherein the width of a light-emitting point of the optical semiconductor chip is detected by integrating the etching indicator on the optical semiconductor chip, after chip completion.

* * * * *